United States Patent
Kim et al.

(10) Patent No.: US 10,304,766 B2
(45) Date of Patent: May 28, 2019

(54) SEMICONDUCTOR PACKAGE HAVING A CIRCUIT PATTERN

(71) Applicant: SAMSUNG ELECTRONICS CO., LTD., Suwon-si, Gyeonggi-Do (KR)

(72) Inventors: Bu-won Kim, Yongin-si (KR); Dae-ho Lee, Hwaseong-si (KR); Hee-jin Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/880,917

(22) Filed: Jan. 26, 2018

(65) Prior Publication Data

US 2019/0051592 A1 Feb. 14, 2019

(30) Foreign Application Priority Data

Aug. 11, 2017 (KR) .......................... 10-2017-0102568

(51) Int. Cl.
*H01L 23/52* (2006.01)
*H01L 23/498* (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC .......... H01L 23/49816; H01L 21/4857; H01L 23/49838; H01L 23/49822; H01L 21/486;
(Continued)

(56) References Cited

U.S. PATENT DOCUMENTS 6,864,434 B2 * 3/2005 Chang ............... H01L 23/49822
174/255
7,538,438 B2 * 5/2009 Yu ..................... H01L 23/49811
257/773
(Continued)

FOREIGN PATENT DOCUMENTS

JP 09260579 10/1997
JP 2002076530 3/2002
(Continued)

*Primary Examiner* — Luan C Thai
(74) *Attorney, Agent, or Firm* — F. Chau & Associates, LLC

(57) ABSTRACT

A semiconductor package includes a circuit pattern extending in a horizontal direction. The circuit pattern is conductive. A first insulation layer is disposed on the circuit pattern. A semiconductor chip is disposed on the first installation layer. The first insulation layer includes first protrusions which protrude from a bottom surface of the first insulation layer, penetrate through at least a portion of the circuit pattern, and have a mesh structure. A second protrusion protrudes from the bottom surface of the first insulation layer and penetrates at least a portion of the circuit pattern. The second protrusion is spaced apart from the semiconductor chip in the horizontal direction. The second protrusion has a width in the horizontal direction wider than that of each of the first protrusions.

20 Claims, 12 Drawing Sheets

(51) Int. Cl.
*H01L 25/18* (2006.01)
*H01L 21/48* (2006.01)
*H01L 23/538* (2006.01)
*H01L 25/065* (2006.01)
*H01L 23/00* (2006.01)

(52) U.S. Cl.
CPC .. *H01L 23/49816* (2013.01); *H01L 23/49822* (2013.01); *H01L 23/49866* (2013.01); *H01L 23/5383* (2013.01); *H01L 23/5386* (2013.01); *H01L 25/0655* (2013.01); *H01L 25/18* (2013.01); *H01L 24/48* (2013.01); *H01L 2224/48091* (2013.01); *H01L 2224/48106* (2013.01); *H01L 2224/48228* (2013.01); *H01L 2924/1515* (2013.01); *H01L 2924/15747* (2013.01)

(58) Field of Classification Search
CPC . H01L 25/18; H01L 23/5386; H01L 25/0655; H01L 23/5383
USPC .......................................................... 257/747
See application file for complete search history.

(56) References Cited

U.S. PATENT DOCUMENTS

| | | | |
|---|---|---|---|
| 7,919,716 | B2 | 4/2011 | Muro et al. |
| 8,405,231 | B2 | 3/2013 | Hayashi |
| 8,686,298 | B2* | 4/2014 | Nakamura ........ H01L 23/49822 |
| | | | 174/255 |
| 8,754,333 | B2 | 6/2014 | Yoshimura et al. |
| 8,836,109 | B2* | 9/2014 | Yun ....................... H01L 23/481 |
| | | | 257/700 |
| 9,287,194 | B2 | 3/2016 | Hung |
| 2012/0024586 | A1 | 2/2012 | Yoshimura et al. |
| 2015/0179666 | A1 | 6/2015 | Chai |

FOREIGN PATENT DOCUMENTS

| | | |
|---|---|---|
| JP | 2006294683 | 10/2006 |
| JP | 4001786 | 10/2007 |
| JP | 2013122962 | 6/2013 |
| JP | 5482546 | 5/2014 |
| KR | 101350610 | 1/2014 |
| KR | 1020140137628 | 12/2014 |

* cited by examiner

SEMICONDUCTOR PACKAGE HAVING A CIRCUIT PATTERN

CROSS-REFERENCE TO RELATED APPLICATION

This application claims priority under 35 U.S.C. § 119 to Korean Patent Application No. 10-2017-0102568, filed on Aug. 11, 2017, in the Korean Intellectual Property Office, the disclosure of which is incorporated by reference herein in its entirety.

TECHNICAL FIELD

Exemplary embodiments of the present inventive concept relate to a semiconductor package, and more particularly, to a semiconductor package having a circuit pattern.

DISCUSSION OF RELATED ART

A package substrate is an electronic component on which electronic components such as semiconductor chips may be mounted. As electronic devices have increased in capacity, as well as become faster, more functional, and smaller in size, package substrates are being developed with various materials and structures. For example, various types of package substrates are being developed, such as a printed circuit board including a plurality of relatively thin substrates integrated with one another, a flexible substrate including a plastic film coated with a copper foil pattern, and a tape substrate.

SUMMARY

An exemplary embodiment of the present inventive concept provides a semiconductor package including a package substrate with enhanced reduced effective coefficient of thermal expansion (CTE)

According to an exemplary embodiment of the present inventive concept, a semiconductor package includes a circuit pattern extending in a horizontal direction. The circuit pattern is conductive. A first insulation layer is disposed on the circuit pattern. A semiconductor chip is disposed on the first insulation layer. The first insulation layer includes first protrusions which protrude from a bottom surface of the first insulation layer, penetrate through at least a portion of the circuit pattern, and have a mesh structure. A second protrusion protrudes from the bottom surface, of the first insulation layer and penetrates at least a portion of the circuit pattern. The second protrusion is spaced apart from the semiconductor chip in the horizontal direction. The second protrusion has a width in the horizontal direction wider than that of each of the first protrusions.

According to an exemplary embodiment of the present inventive concept, a semiconductor package includes a package substrate having a chip mounting region and a non-mounting region defined by the chip mounting region. The package substrate includes a circuit pattern which extends in the chip mounting region and the non-mounting region in a horizontal direction and includes a conductive material. An insulation layer is disposed on the circuit pattern. A semiconductor chip is disposed on the package substrate in the chip mounting region. The non-mounting region includes a coefficient of thermal expansion (CTE) adjusting region. A mass ratio of the conductive material in a portion of the package substrate in the CTE adjusting region is smaller than a mass ratio of the conductive material in a portion of the package substrate in the chip mounting region.

According to an exemplary embodiment of the present inventive concept, a semiconductor package includes a first circuit pattern extending in a horizontal direction. The first circuit pattern is conductive. A first insulation layer is disposed on a top surface of the first circuit pattern. Semiconductor chips are disposed on a top surface of the first insulation layer. A second insulation layer is disposed on a bottom surface of the first circuit pattern. A second circuit pattern is disposed on a bottom surface of the second insulation layer and extends in the horizontal direction. The second circuit pattern is conductive. The first insulation layer includes a plurality of first protrusions which protrude from a bottom surface of the first insulation layer, penetrate through at least a portion of the first circuit pattern, and have a mesh structure. Second protrusions protrude from the bottom surface of the first insulation layer, are spaced apart from the semiconductor chips in the horizontal direction, and penetrate at least a portion of the first circuit pattern. A horizontal cross-sectional area of each of the second protrusions is larger than a horizontal cross-sectional area of each of the first protrusions.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1A:
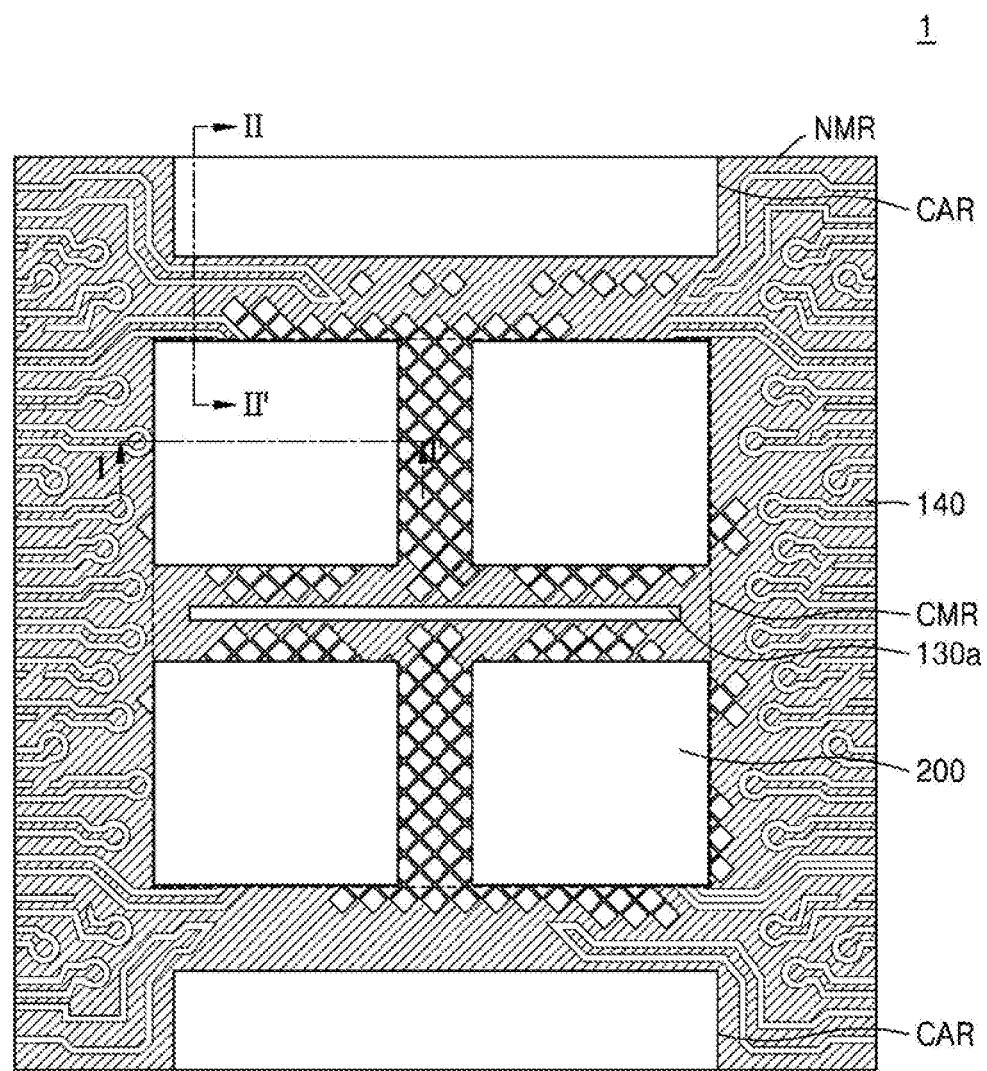
FIG. 1A is a plan view of a semiconductor package according to an exemplary embodiment of the present inventive concept.
Figure 1B:
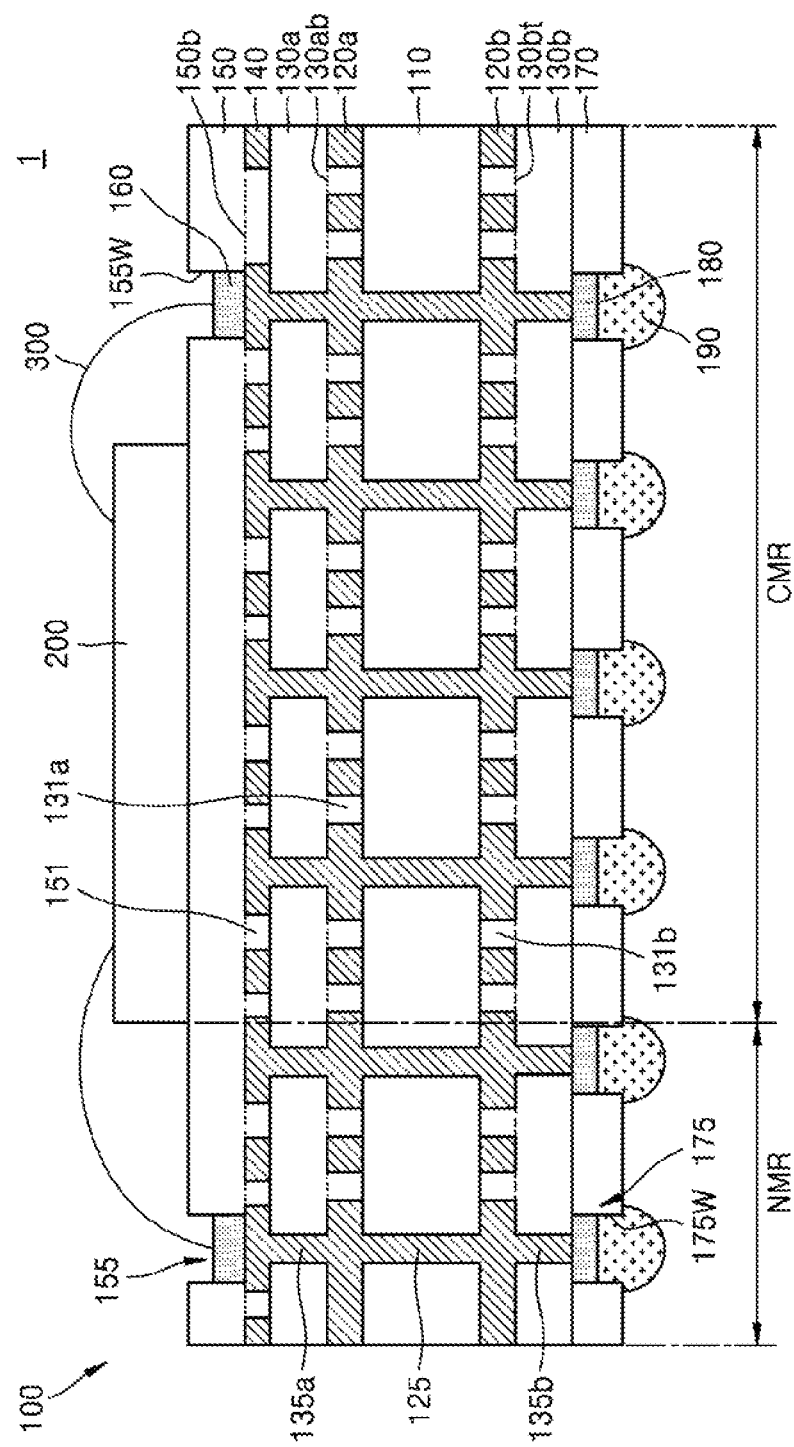
FIG. 1B is a cross-sectional view, taken along line I-I' of FIG. 1A.
Figure 1C:
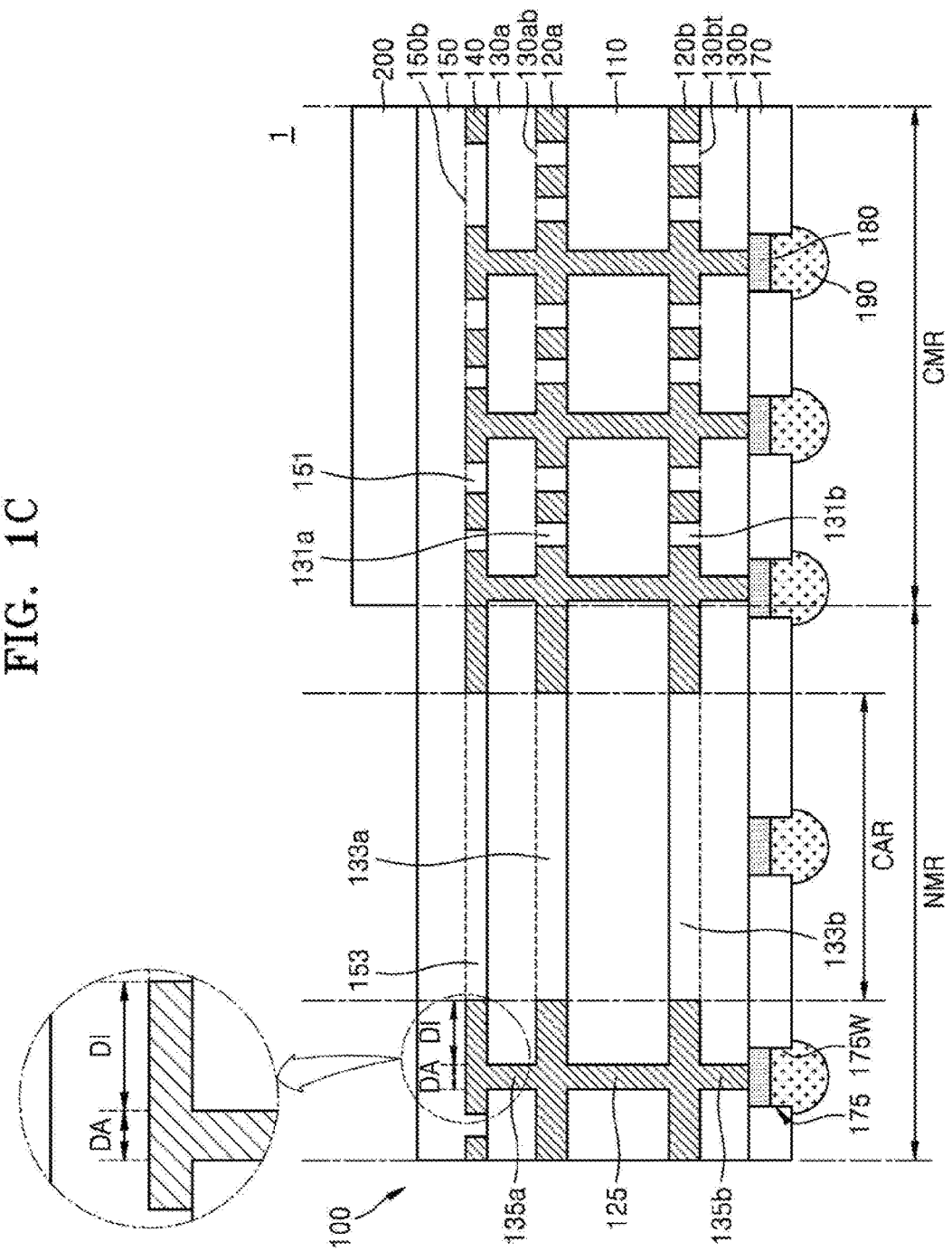
FIG. 1C is a cross-sectional view, taken along line II-II' of FIG. 1A.

FIG. 1A is a plan view of a semiconductor package according to an exemplary embodiment of the present inventive concept. FIG. 1B is a cross-sectional view, taken along line 1-I' of FIG. 1A. FIG. 1C is a cross-sectional view, taken along line II-II' of FIG. 1A.

Referring to FIGS. 1A, 1B and 1C, a semiconductor package 1 may include a package substrate 100, a semiconductor chip 200, and a bonding wire 300.

For clarity of description, an upper protective layer 150 of the package substrate 100 is omitted in FIG. 1A. A chip mounting region CMR and a non-mounting region NMR may be defined on the package substrate 100. The chip mounting region CMR may be in a position corresponding to a region on the package substrate 100 in which the semiconductor chip 200 is mounted. The non-mounting region NMR may be in a position corresponding to a region on the package substrate 100 in which the semiconductor chip 200 is not mounted. The non-mounting region may be defined as a region outside the chip mounting region CMR. Thus, the semiconductor chip 200 and the non-mounting region NMR may be horizontally separated from each other. The non-mounting region NMR may include a coefficient of thermal expansion (CTE) adjusting, region. Although FIG. 1 shows that the package substrate 100 includes two CTE adjusting regions CARs, exemplary embodiments of the present inventive concept are not limited thereto. For example, the package substrate 100 may include one, three, or more CTE adjusting regions.

Referring to FIG. 1A, the package substrate 100 may be a double-sided package substrate having wires on two surfaces; however, exemplary embodiments of the present inventive concept are not limited thereto. For example, according to an exemplary embodiment of the present inventive concept, the package substrate may be a single-sided package substrate having wires on only one surface.

The package substrate 100 may include a base layer 110, a base via 125, an upper conductive pattern 120a, a lower conductive pattern 120b, an upper in; layer 130a, a lower insulation layer 130b, an upper via 135a, a lower via 135b, a circuit pattern 140, the upper protective layer 150, an upper contact layer 160, a lower protective layer 170, a lower contact layer 180, and an external connecting terminal 190. According to an exemplary embodiment of the present inventive concept, the package substrate 100 may be a printed circuit board or a flexible substrate.

The base layer 110 may include resin and glass fiber. The resin that may be included in the base layer 110 may be at least one material selected from among phenol resin, epoxy resin, or polyimide. According to an exemplary embodiment of the present inventive concept, the base layer 110 may include a material selected from among Flame Retardant 4 (FR4), tetrafunctional epoxy, polyphenyl ether, epoxy/polyphenylene oxide, bismaleimide triazine (BT), Thermount, cyanate ester, polyimide, a prepreg, an Ajinomoto Build-up Film (ABF) of Ajinomoto Co., Ltd, or liquid crystal polymer. However, exemplary embodiments of the present inventive concept are not limited thereto. For example, the base layer 110 may include silicon oxide, silicon oxynitride, silicon nitride, or any combination thereof. Glass fiber that may be included in the base layer 110 is one of a number of reinforcing materials and may be provided by twisting several hundreds of glass filaments having a diameter of from about 5 μm to about 15 μm into fiber bundles and weaving the fiber bundles. The glass filament may be a silica-based processed ore product. The glass fiber may exhibit relatively high heat resistance, mechanical strength, and electrical insulation. However, exemplary embodiments of the present inventive concept are not limited thereto. According to an exemplary embodiment of the present inventive concept, the base layer 110 of the package substrate 100 may be omitted.

The upper conductive pattern 120a may be disposed on a top surface of the base layer 110, and the lower conductive pattern 120b may be disposed on a bottom surface of the base layer 110. The upper conductive pattern 120a and the lower conductive pattern 120b may each include a conductive material. The upper conductive pattern 120a and the lower conductive pattern 120b may each include at least one selected from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), graphene, or alloys thereof. The upper and lower conductive patterns 120a and 120b may each include at least a portion having a mesh structure.

The mesh structure may be a structure similar to a mesh network. The mesh structure may be a structure including a plurality of first straight lines extending substantially in parallel along a first direction on one plane, and a plurality of second straight lines extending substantially in parallel along a second direction intersecting the first direction. Distances between adjacent first straight lines may be substantially the same as each other, but exemplary embodiments of the present inventive concept are not limited thereto. Distances between adjacent second straight lines may be substantially the same as each other, but exemplary embodiments of the present inventive concept are not limited thereto. The distances between the adjacent first straight lines may be substantially identical to the distances between the adjacent second straight lines, but exemplary embodiments of the present inventive concept are not limited thereto.

The upper conductive pattern 120a and the lower conductive pattern 120b may be connected to each other via the base via 125. The base via 125 may penetrate through the base layer 110. A vertical length of the base via 125 may be substantially identical to a thickness of the base layer 110 in the vertical direction. The vertical direction may be a direction orthogonal to a horizontal direction in which the base layer 110 extends. The base via 125 may include a conductive material. The base via 125 may include a material which is the same as that of the upper conductive pattern 120a, but exemplary embodiments of the present inventive concept are not limited thereto. The base via 125 may be disposed in the chip mounting region CMR and the non-mounting region NMR. The base via 125 is not disposed in the CTE adjusting region CAR. The base via 125 may be horizontally spaced apart from the CTE adjusting,region CAR in the horizontal direction. A horizontal distance DI between the base via 125 and the CTE adjusting region CAR may be about three times greater than a diameter DA of the base via 125 (see, e.g., FIG. 1C), but exemplary embodiments of the present inventive concept are not limited thereto. The horizontal distance DI between the base via 125 closest to the CTE adjusting region CAR and the CTE adjusting region CAR may be shorter than the length of each of edges of the package substrate 100. For example, the horizontal distance DI between the base via 125 closest to the CTE adjusting region CAR and the CTE adjusting region CAR may be shorter than a width of an upper surface of the base layer 110 in the horizontal direction. The base layer 110 may continuously extend in the CTE adjusting region CAR (e.g., along the horizontal direction). For example, the base layer 110 may overlap substantially the entire CTE adjusting region CAR along a direction orthogonal to the horizontal direction.

The upper insulation layer 130a may be disposed on a top surface of the upper conductive pattern 120a. The upper insulation layer 130a may include a resin. The upper insulation layer 130a may include at least one material selected from among phenol resin, epoxy resin, or polyimide. The upper insulation layer 130a may include at least one material selected from among FR4, tetrafunctional epoxy, polyphenyl ether, epoxylpolyphenylene oxide, BT, Thermount, cyanate ester, polyimide, or liquid crystal polymer.

The upper insulation layer 130a may include first insulation layer protrusions 131a and a second insulation layer protrusion 133a protruding from a bottom surface 130ab of the upper insulation layer 130a. According to an exemplary embodiment of the present inventive concept, the first insulation layer protrusions 131a and the second insulation layer protrusion 133a may be formed integrally with the upper insulation layer 130a. However, for clarify of description, the bottom surface 130ab of the upper insulation layer 130a will refer to a surface located at a substantially a same level as the top surface of the upper conductive pattern 120a. A top surface 130bt of the lower insulation layer 130b and a bottom surface 150b of the upper protective layer 150, which will be described in more detail below, are also defined in a similar manner. For example, the top surface 130bt of the lower insulation layer 130b may refer to a surface located at a substantially same level as a bottom surface of the lower conductive pattern 120b, and the bottom surface 150b of the upper protective layer 150 may refer to a surface located at a substantially same level as a top surface of the circuit pattern 140.

The first insulation layer protrusions 131a and the second insulation layer protrusion 133a may protrude from the bottom surface 130ab of the upper insulation layer 130a and may at least partially penetrate the upper conductive pattern 120a. Vertical lengths of the first insulation layer protrusions 131a and the second insulation layer protrusion 133a may be substantially identical to a thickness of the upper conductive pattern 120a. The first insulation layer protrusions 131a and the second insulation layer protrusion 133a may completely penetrate through the upper conductive pattern 120a. For example, the first insulation layer protrusions 131a and the second insulation layer protrusion 133a may extend entirely through the upper conductive pattern 120a along the direction orthogonal to the horizontal direction. Bottom surfaces of the first insulation layer protrusions 131a and the second insulation layer protrusion 133a may be in direct contact with the top surface of the base layer 110.

The first insulation layer protrusions 131a may be disposed in the chip mounting region CMR. However, exemplary embodiments of the present inventive concept are not limited thereto, and some of the first insulation layer protrusions 131a may be disposed in the non-mounting region NMR. The first insulation layer protrusions 131a may have a mesh structure. The portion of the upper conductive pattern 120a having a mesh structure may be in a position corresponding to the first insulation layer protrusions 131a.

The second insulation layer protrusion 133a may be disposed in the CTE adjusting region CAR. A horizontal cross-sectional area of the second insulation layer protrusion 133a may be greater than a horizontal cross-sectional area of each of the first insulation layer protrusions 131a. As an example, a width of the second insulation layer protrusion 133a in the horizontal direction may be greater than that of the first insulation layer protrusions 131a. The second insulation layer protrusion 133a may continuously extend in the CTE adjusting region CAR (e.g., along the horizontal direction). Thus, the second insulation layer protrusion 133a may overlap substantially the entire CTE adjusting region CAR along the direction orthogonal to the horizontal direction. The horizontal cross-sectional area of the second insulation layer protrusion 133a may be substantially identical to an area of the CTE adjusting region CAR, but exemplary embodiments of the present inventive concept are not limited thereto. As an example, a width of the second insulation layer protrusion 133a in the horizontal direction truly be substantially identical to the width of the CTE adjusting region CAR. The second insulation layer protrusion 133a need not have a mesh structure.

The lower insulation layer 130b may be disposed on the bottom surface of the lower conductive pattern 120b. The lower insulation layer 130b may include a same material as the upper insulation layer 130a. The lower insulation layer 130b may include third insulation layer protrusions 131b and a fourth insulation layer protrusion 133b.

The third insulation layer protrusions 131b and the fourth insulation layer protrusion 133b may protrude from the top surface 130bt of the lower insulation layer 130b and may at least partially penetrate the lower conductive pattern 120b. Vertical lengths of the third insulation layer protrusions 131b and the fourth insulation layer protrusion 133b may be substantially identical to a thickness of the lower conductive pattern 120b. The third insulation layer protrusions 131b and the fourth insulation layer protrusion 133b may completely penetrate through the lower conductive pattern 120b (e.g., along the direction orthogonal to the horizontal direction). The top surfaces of the third insulation layer protrusions 131b and the fourth insulation layer protrusion 133b may be in direct contact with the bottom surface of the base layer 110.

The third insulation layer protrusions 131b may be disposed in the chip mounting region CMR. However, exemplary embodiments of the present inventive concept are not limited thereto, and some of the third insulation layer protrusions 131b may be disposed in the non-mounting region NMR. The third insulation layer protrusions 131b may have a mesh structure. The portion of the lower conductive pattern 120b having a mesh structure may be in a position corresponding to the third insulation layer protrusions 131b.

The fourth insulation layer protrusion 133b may be disposed in the CTE adjusting region CAR. A horizontal cross-sectional area of the fourth insulation layer protrusion 133b may be greater than a horizontal cross-sectional area of each of the third insulation layer protrusions 131b. As an example, a width of the fourth insulation layer protrusion 133b in the horizontal direction may be greater than that of each of the third insulation layer protrusions 131b. The fourth insulation layer protrusion 133b may continuously extend in the CTE adjusting region CAR (e.g., in the horizontal direction). The horizontal cross-sectional area of the fourth insulation layer protrusion 133b may be substantially identical to the area of the CTE adjusting region CAR, but exemplary embodiments of the present inventive concept are not limited thereto. As an example, a width of the fourth insulation layer protrusion 133b in the horizontal direction may be substantially identical to that of the CTE adjusting region CAR. The fourth insulation layer protrusion 133b need not have a mesh structure.

The circuit pattern 140 may be disposed on a top surface of the upper insulation layer 130a. The circuit pattern 140 may include a material which is the same as that of the upper conductive pattern 120a. The circuit pattern 140 and the upper conductive pattern 120a may be connected to each other via the upper via 135a. The upper via 135a may penetrate through the upper insulation layer 130a. The lower via 135b may penetrate through the lower insulation layer 130b and may be connected to the lower conductive pattern 120b. The upper via 135a and the lower via 135b may include a material which is the same as that of the base via 125. Thus, the circuit pattern 140, the upper conductive pattern 120a and the lower conductive pattern 120b may be integrally formed of a same material.

The upper via 135a and the lower via 135b may be disposed in the chip mounting region CMR and the non-mounting region NMR. The upper via 135a and the lower via 135b are not disposed in the CTE adjusting region CAR. The upper via 135a and the lower via 135b may be horizontally spaced apart along the horizontal direction from the CTE adjusting region CAR. The horizontal distance DI between each of the upper via 135a and the lower via 135b and the CTE adjusting region CAR may be about three times or greater than the diameter DA of each of the upper via 135a and the lower via 135b, but exemplary embodiments of the present inventive concept are not limited thereto. The horizontal distance DI between the upper via 135a or the lower via 135b closest to the CTE adjusting region CAR and the CTE adjusting region CAR may be smaller than the length of each of edges of the package substrate 100. For example, the horizontal distance DI between the upper via 135a or the lower via 135b closest to the CTE adjusting region CAR and the CTE adjusting region CAR may be smaller than a width of the package substrate 100 in the horizontal direction. The upper insulation layer 130a and the lower insulation layer 130b may continuously extend in the CTE adjusting region CAR. As an example, the upper insulation layer 130a and the lower insulation layer 130b may overlap substantially the entire CTE adjusting region CAR along the direction orthogonal to the horizontal direction.

The upper protective layer 150 may be disposed on the circuit pattern 140. The upper protective layer 150 may be an insulating coating film. The upper protective layer 150 may be referred to as an insulation layer (e.g., as a first insulation layer). The upper protective layer 150 may be, for example, a solder resist layer. The upper protective layer 150 may include an upper sidewall 155W that defines an upper contact hole 155 exposing a portion of the top surface of the circuit pattern 140. The upper protective layer 150 may protect the circuit pattern 140 and prevent a bridge phenomenon between circuit patterns 140.

The upper protective layer 150 may include first protective layer protrusions 151 and a second protective layer protrusion 153. The first protective layer protrusions 151 and the second protective layer protrusion 153 may protrude from the bottom surface 150b of the upper protective layer 150 and may at least partially penetrate the circuit pattern 140 (e.g., along the direction orthogonal to the horizontal direction). Vertical lengths of the first protective layer protrusions 151 and the second protective layer protrusions 153 may be substantially identical to a thickness of the circuit pattern 140. The first protective layer protrusions 151 and the second protective layer protrusion 153 may completely penetrate through the circuit pattern 140. Bottom surfaces of the first protective layer protrusions 151 and the second protective layer protrusion 153 may be in direct contact with the top surface of the upper insulation layer 130a.

The first protective layer protrusions 151 may be disposed in the chip mounting region. CMR. However, exemplary embodiments of the present inventive concept are not limited thereto, and some of the first protective layer protrusions 151 may be disposed in the non-mounting region NMR. The first protective layer protrusions 151 may have a mesh structure. A portion of the circuit pattern 140 having a mesh structure may be in a position corresponding to the first protective layer protrusions 151.

The second protective layer protrusion 153 may be disposed in the CTE adjusting region CAR. A horizontal cross-sectional area of the second protective layer protrusion 153 may he greater than a horizontal cross-sectional area of each of the first protective layer protrusions 151. As an example, a width of the second protective layer protrusion 153 in the horizontal direction may be greater than that of each of the first protective layer protrusions 151. The second protective layer protrusion 153 may continuously extend in the CTE adjusting region CAR. The horizontal cross-sectional area of the second protective layer protrusion 153 may be substantially identical to the area of the CTE adjusting region CAR, but exemplary embodiments of the present inventive concept are not limited thereto. As an example, a width of the second protective protrusion 153 in the horizontal direction may be substantially identical to that of the CIE adjusting region CAR. The second protective layer 153 need not have a mesh structure.

The upper contact layer 160 may be disposed inside the upper contact hole 155 of the upper protective layer 150. The upper contact layer 160 may be connected to the upper via 135a. The upper sidewall 155W of the upper protective layer 150 defining the upper contact hole 155 may cover side surfaces of the upper contact layer 160. The upper contact layer 160 may include a conductive material. The upper contact layer 160 may include at least one selected from among Cu, Al, Ni, Ag, Au, Pt, Sn, PB, Ti, Cr, Pd, In, Zn, C, graphene, or alloys thereof According to an exemplary embodiment of the present inventive concept, when the upper contact layer 160 includes Ni, it may include phosphor (P), which may prevent oxidation of Ni included in the upper contact layer 160. For example, the upper contact layer 160 may include P at a weight ratio of about 5% to about 12%. According to an exemplary embodiment of the present inventive concept, a width of the upper contact layer 160 may be smaller than a width of the circuit pattern 140. According to an exemplary embodiment of the present inventive concept, a thickness of the upper contact layer 160 may be from about 2 μm to 8 μm (e.g., in the direction orthogonal to the horizontal direction), but exemplary embodiments of the present inventive concept are not limited thereto.

The lower protective layer 170 may be provided on a bottom surface of the lower insulation layer 130h. The lower protective layer 170 may have a composition which is substantially the same as that of the upper protective layer 150. The lower protective layer 170 may include a lower sidewall 175W defining a lower contact hole 175 that exposes the bottom surface of the lower insulation layer 130b and/or a bottom surface of the lower via 135b.

The lower contact layer 180 may be disposed in the lower contact hole 175 of the lower protective layer 170. A top surface of the lower contact layer 180 may be in direct contact with the lower via 135b and/or the lower insulation layer 130b. The lower sidewall 175W of the lower protective layer 170 defining the lower contact hole 175 may cover side surfaces of the lower contact layer 180. The lower contact layer 180 may include a material which is the same as that of the upper contact layer 160.

The external connecting terminal 190 may be attached to the lower contact layer 180. The external connecting terminal 190 may include at least one selected from among Cu, Al, Ni, Ag, Au, Pt, Sn, PB, Ti, Cr, Pd, In, Zn, C, graphene, or alloys thereof. The external connecting terminal 190 may be, for example, a solder ball or a solder bump. The external connecting terminal 190 may electrically connect the semiconductor package 1 to an external device. Some of a plurality of external connecting terminals 190 may be provided for signal transmission, while some others of the plurality of external connecting terminals 190 may be provided to deliver operating power, input/output power, or ground potential to the package substrate 100.

While the package substrate 100 may include two insulation layers 130*a* and 130*b*, three conductive layers 120*a*, 120*b*, and 140, two protective layers 150 and 170, and vias 125, 135*a*, and 135*b* formed therebetween, exemplary embodiments of the present inventive concept are not limited thereto. A greater or lower number of each component may be provided, and each component may be modified or omitted, depending on, for example, the product to which they are applied.

The semiconductor chip 200 may be disposed on the package substrate 100. The semiconductor Chip 200 may be a logic chip, a memory chip, or a combination thereof. When the semiconductor chip 200 is a memory chip, the semiconductor chip 200 may include any of a DRAM, an SRAM, a flash memory, an EEPROM, a PRAM, an MRAM, and an RRAM. The semiconductor package 1 in which such memory chips are mounted on a package substrate 100 may be a memory module. Although FIGS. 1A through 1C show that the semiconductor chip 200 simply has a rectangular shape, the semiconductor chip 200 may be mounted on the package substrate 100 in the form of a sealed package sealed by a sealant instead of being mounted on the package substrate 100 in the form of a bare chip.

According to an exemplary embodiment of the present inventive concept, a buffer chip may be additionally provided on the package substrate 100. When the semiconductor chip 200 is included in a memory device, the buffer chip may be disposed between the semiconductor chip 200 and an external memory controller and/or an internal memory controller of the semiconductor package 1 and relay data transmission. For example, the buffer chip may be an advanced memory buffer (AMB). When the buffer chip is an AMB, the buffer chip may be connected to the semiconductor chip 200 mounted in the semiconductor package 1, may store data transmitted from the external memory controller and/or the internal memory controller of the semiconductor package 1 in the semiconductor chip 200, may read data requested by the external memory controller and/or the internal memory controller of the semiconductor package 1 from the semiconductor chip 200, and may transmit the data to the external memory controller and/or the internal memory controller of the semiconductor package 1. Also, the buffer chip may correspond to a separate buffer chip that transfers the request and storage of data of the memory controller to the AMB of the memory module. When a buffer chip is additionally provided, a memory module having a relatively high transmission bandwidth and relatively high capacity may be implemented. Alternatively, a buffer chip may be omitted.

While four semiconductor chips may be mounted, exemplary embodiments of the present inventive concept are not limited thereto, and one, two, three, or five or more semiconductor chips may be mounted.

Although the package substrate 100 may include the external connecting terminal 190 adjacent to the bottom surface of the package substrate 10, exemplary embodiments of the present inventive concept are not limited thereto. For example, in an exemplary embodiment of the present inventive concept, a package substrate may include a connection pin or a contact tab formed in a printed circuit board for a memory module, the package substrate being insertable into a slot provided in a mainboard. In this case, a semiconductor package may correspond to a single in-line memory module (SIMM) in which tabs are disposed on one surface, or a dual in-line memory module (DIMM) in which tabs are disposed on two surfaces.

The bonding wire 300 may electrically interconnect the package substrate 100 and the semiconductor chip 200. The bonding wire 300 may include, for example, a conductive material. The bonding wire 300 may include at least one selected from among Cu, Al, Ni, Ag, Au, Pt, Sn, PB, Ti, Cr, Pd, In, Zn, C, graphene, or alloys thereof. The bonding wire 300 may electrically interconnect a top surface of the semiconductor chip 200 and the upper contact layer 160 of the package substrate 100. However, exemplary embodiments of the present inventive concept are not limited thereto, and the semiconductor chip 200 may be provided in the form of a flip-chip on the package substrate 100, in which the semiconductor chip 200 may be electrically connected to the package substrate 100 via solder balls and/or solder bumps.

Figure 2:
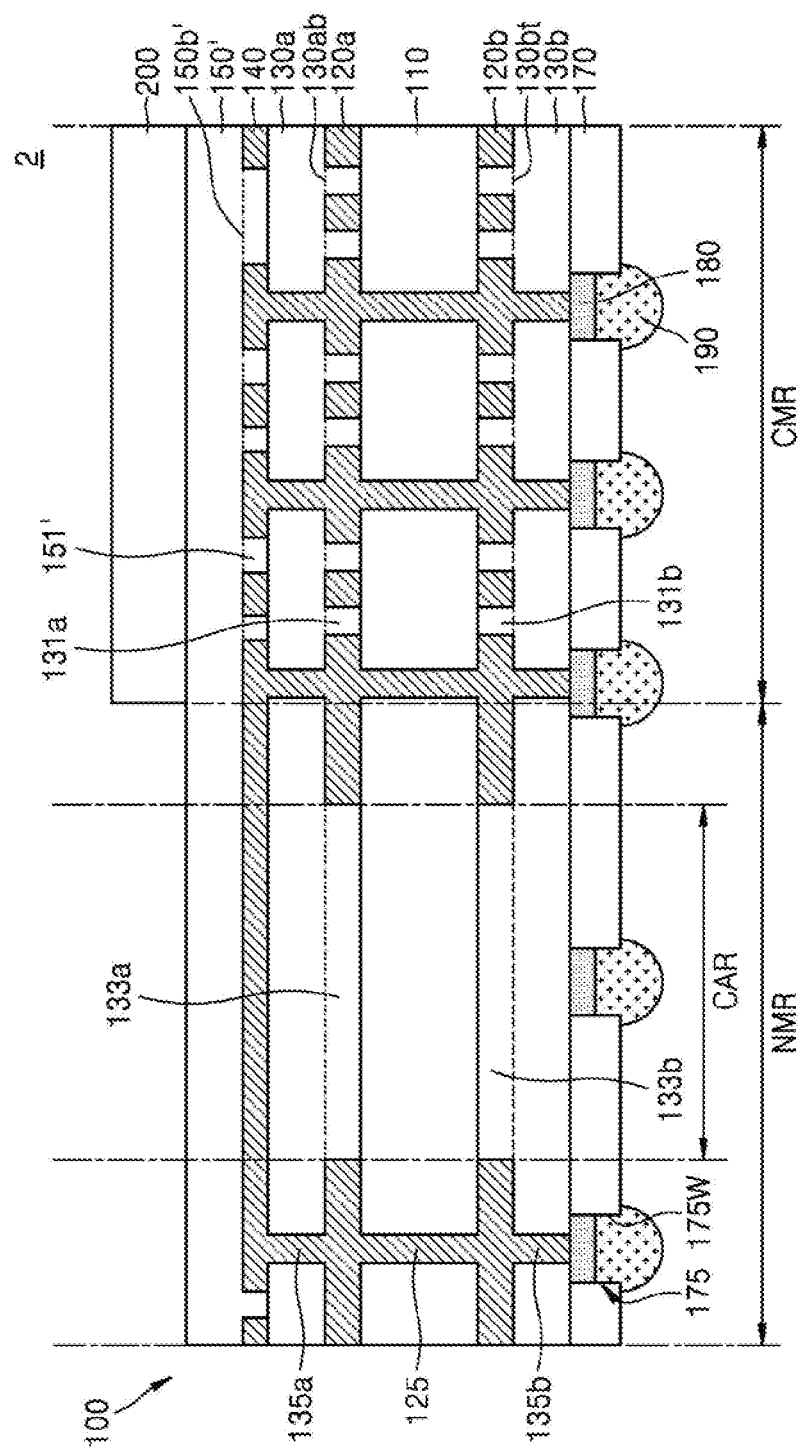
FIGS. 2 and 3 are cross-sectional views showing portions of a semiconductor package according to an exemplary embodiment of the present inventive concept.
Figure 3:
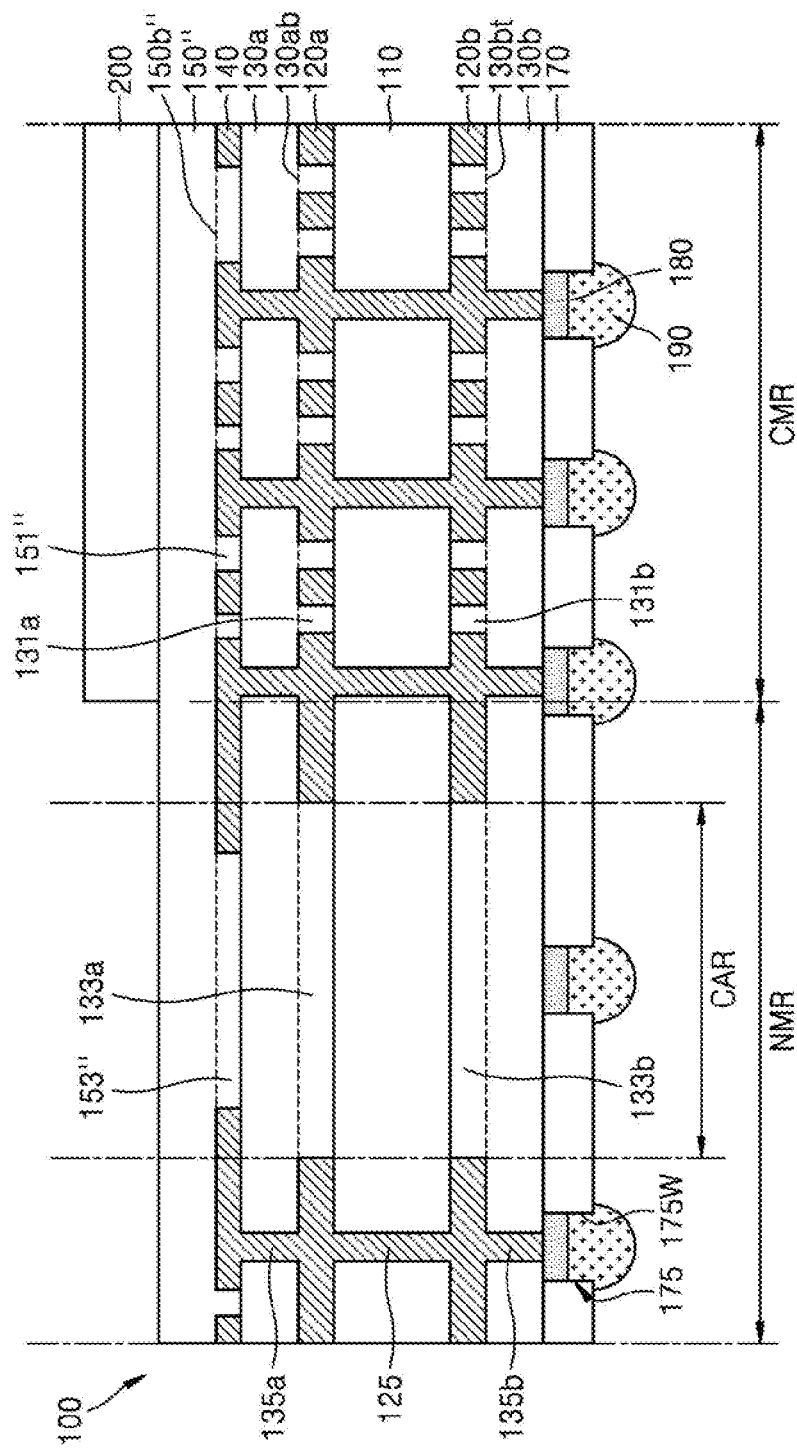

FIGS. 2 and 3 are cross-sectional views showing portions of a semiconductor package according to an exemplary embodiment of the present inventive concept. FIGS. 2 and 3 are cross-sectional views taken along line II-II' of FIG. 1A. Descriptions below that would be the same as those provided above with reference to FIGS. 1A, 1B and 1C may be omitted below.

Referring to FIG. 2, a circuit pattern 140 may extend at least partially in the CTE adjusting region CAR. According to an exemplary embodiment of the present inventive concept, the circuit pattern 140 may continuously extend in the CTE adjusting region CAR. An upper protective layer 150' may include first protective layer protrusions 151' protruding from a bottom surface of the upper protective layer 150' in the chip mounting region CMR. According to an exemplary embodiment of the present inventive concept, the upper protective layer 150' need not include protrusions that protrude from a bottom surface 150*b*' in the CTE adjusting region CAR. However, exemplary embodiments of the present inventive concept are not limited thereto, and the upper insulation layer 130*a* and/or the lower insulation layer 130*b* may be configured so as not to have protrusions in the CTE adjusting region CAR.

Referring to FIG. 3, an upper protective layer 150" may include first protective layer protrusions 151" and a second protective layer protrusion 153" protruding from a bottom surface 150*b*" of the upper protective layer 150". A horizontal cross-sectional area of the second protective layer protrusion 153" may be smaller than the area of the CTE adjusting region CAR. As an example, a width of the second protective layer protrusion 153" in the horizontal direction may be smaller than that of the CTE adjusting region CAR. However, exemplary embodiments of the present inventive concept are not limited thereto.

Figure 4A:
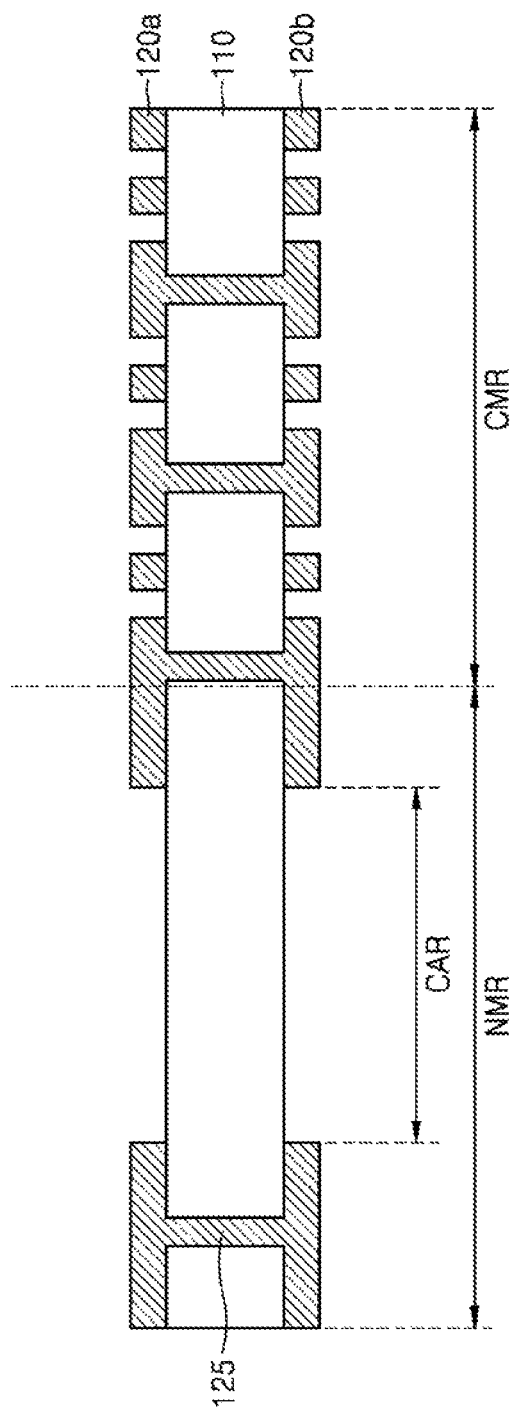
FIGS. 4A, 4B and 4C are cross-sectional views showing a method of fabricating a semiconductor package, according to an exemplary embodiment of the present inventive concept.
Figure 4B:
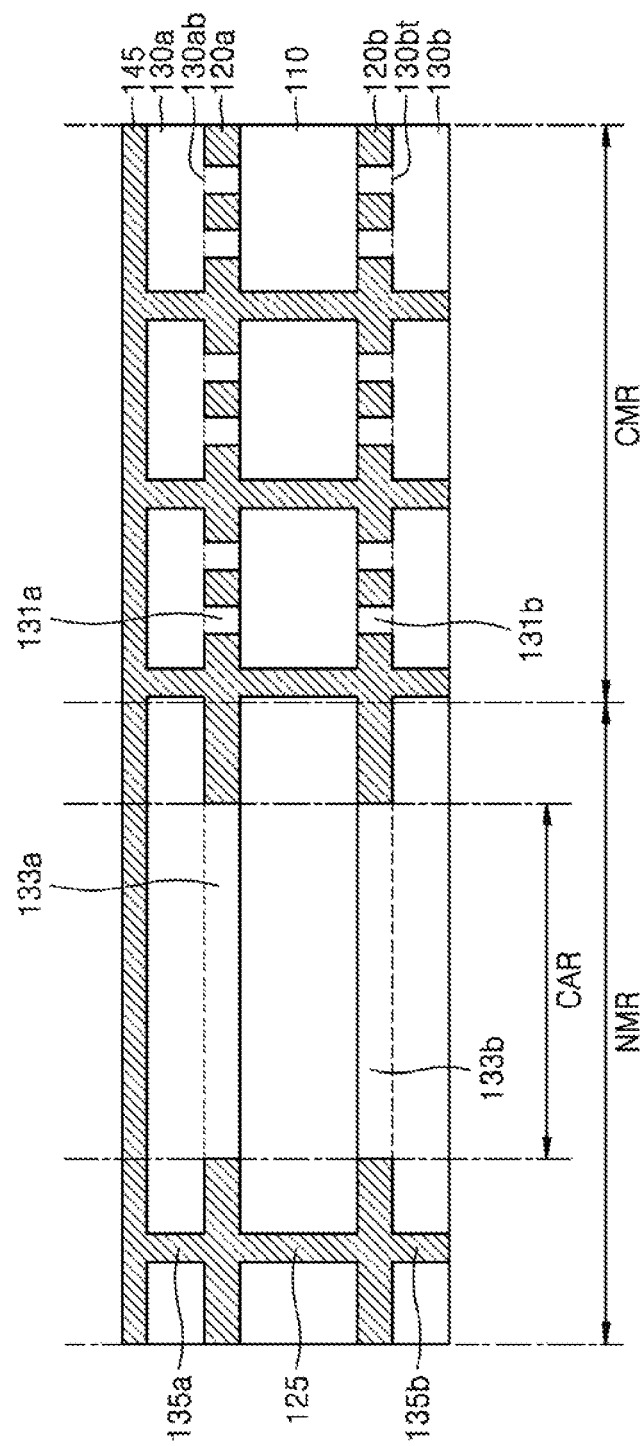
Figure 4C:
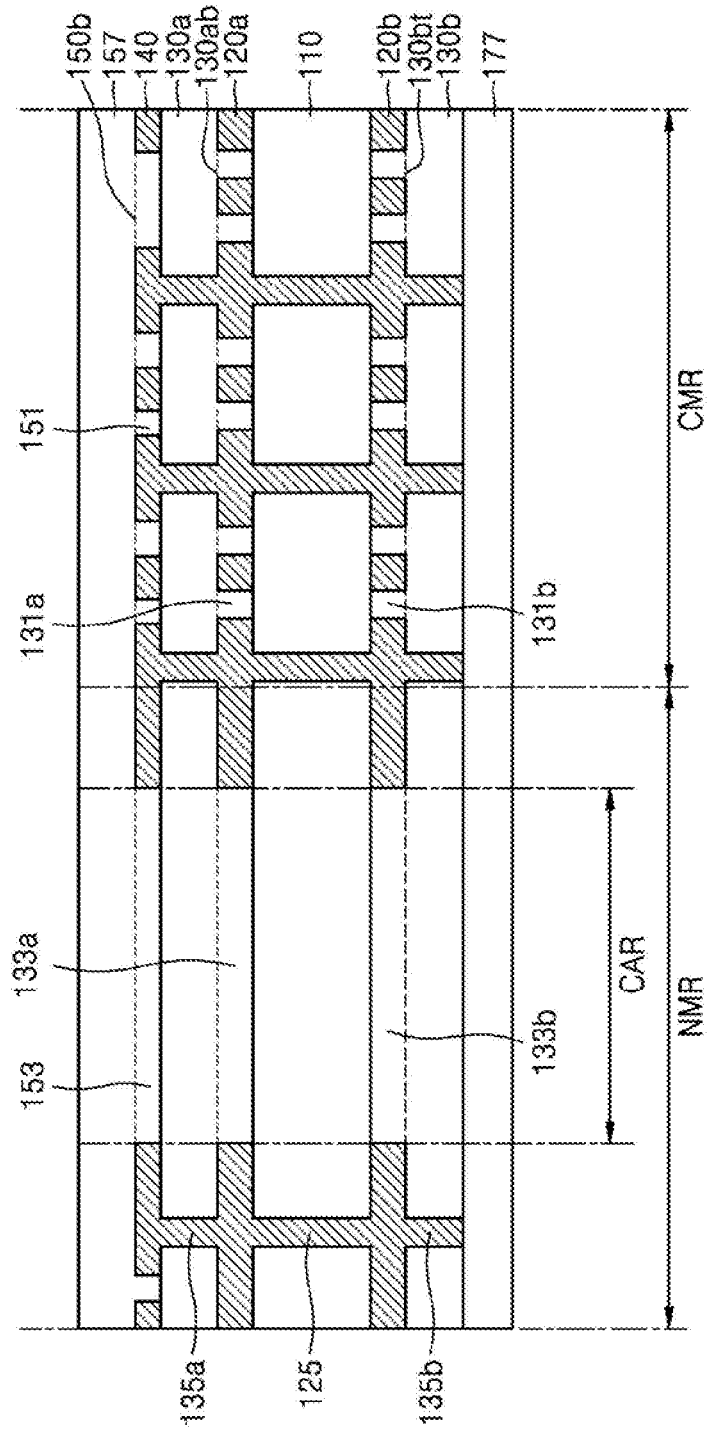

FIGS. 4A, 4B and 4C are cross-sectional views showing a method of fabricating a semiconductor package, according to an exemplary embodiment of the present inventive concept.

Referring to FIG. 4A, an upper conductive pattern 120*a*, a lower conductive pattern 120*b*, and the base via 125 may be formed on the base layer 110.

The base layer 110 may be provided as a core layer. The composition of the base layer 110 may be substantially identical to that described with reference to FIGS. 1A, 1B and 1C. The chip mounting region CMR, the non-mounting region NMR, and the CTE adjusting region CAR may be defined in the base layer 110. The chip mounting region CMR is a region where a semiconductor chip 200 (see, e.g., FIG. 1A) may be mounted in a subsequent process. The non-mounting region NMR is a region where the semiconductor chip 200 (see, e.g., FIG. 1A) is not mounted in a subsequent process and may be defined as a region outside the chip mounting region CMR. The CTE adjusting region CAR may be a region from which a conductive material layer described in more detail below is removed in a subsequent process for adjustment of the CTE.

After a conductive material layer is formed on the top surface of the base layer 110, the upper conductive pattern 120a may be provided by patterning the conductive material layer. Similarly, after a conductive material layer is formed on the bottom surface of the base layer 110, the lower conductive pattern 120b may be provided by patterning the conductive material layer. The conductive material layers may each include conductive materials and may have compositions similar to that of the upper conductive pattern 120a described above with reference to FIGS. 1A, 1B and 1C.

Exemplary methods of patterning conductive material layers include a subtractive-type method and an additive-type method. The subtractive-type method is a method of removing a portion of a metal layer through, for example, etching and may be used to form a pattern having a relatively large pitch. Alternatively, the addition-type method is a method of forming an additional metal pattern on a metal layer through, for example, plating and may be used to form a relatively fine pattern. A subtractive-type method may be relatively inexpensive as compared to an additive-type method, and thus a subtractive-type patterning method may be used for a PCB for a module in which a relatively large pattern is formed. Alternatively, an additive-type patterning method may be used for a component PCB in which a relatively small pattern is formed or a high-cost PCB for a large-scale integrated circuit (LSI). According to an exemplary embodiment of the present inventive concept, a subtractive-type patterning method may be used to pattern conductive material layers.

According to an exemplary embodiment of the present inventive concept, conductive material layers may be patterned through photolithography. According to an exemplary embodiment of the present inventive concept, a laminate film may be coated on the conductive material layers to cover substantially an entire surface of the conductive material layers. Next, a mask corresponding to the shapes of the upper and lower conductive patterns 120a and 120b may be formed, and ultraviolet light may be irradiated to the laminated film by using the mask. After the ultraviolet irradiation of the laminated film, portions of the laminated film irradiated with ultraviolet rays may be removed through a development process. Next, the conductive material layers may be patterned by etching exposed portions of conductive material layers by using the remaining laminate film as an etching mask and then removing the laminate film. According to an exemplary embodiment of the present inventive concept, the conductive material layers may be etched through wet etching, and thus the conductive material layers may have a structure tapered in a depth-wise direction.

Portions of the conductive material layers in the chip mounting region CMR and some of the non-mounting region NMR may be patterned to form a mesh structure. Thus, upper and lower insulation material layers formed in a subsequent process are inserted into openings formed in the upper and lower conductive patterns 120a and 120b, thus increasing adhesion between an insulating layer and conductive patterns. By reducing content of a conductive material having a relatively high CTE compared to an insulation material in the package substrate 100 (see, e.g., FIG. 1A), the CTE of the package substrate 100 (see, e.g., FIG. 1A) may be reduced.

Conductive material layers in the CTE adjusting region CAR may be removed. Thus, in a final package substrate, a mass ratio of the conductive material in a portion of the package substrate in the CTE adjusting region CAR may be lower than a mass ratio of the conductive material in a portion of the package substrate in the chip mounting region CMR. The mass ratio of the conductive material in the portion of the package substrate in the CTE adjusting region CAR may be lower than a mass ratio of the conductive material in a portion of the package substrate in the non-mounting region NMR. The mass ratio of the conductive material in the portion of the package substrate in the CTE adjusting region CAR may be substantially zero, but exemplary embodiments of the present inventive concept are not limited thereto. The mass ratio of a conductive material in a portion of a package substrate in a specific region refers to a ratio of the mass of the conductive material included in the package substrate in the specific region to the mass of the entire portion of the package substrate in the specific region.

The base via 125 may be formed to penetrate through the base layer 110. The base via 125 may be formed by forming a via hole in the upper conductive pattern 120a, the lower conductive pattern 120b, and the base layer 110 via a laser drilling process and then filling the via hole with a conductive material. For example, a $CO_2$ laser or an yttrium-aluminum-garnet (YAG) laser may be used for the laser drilling process. The $CO_2$ laser has a relatively high power and is used to form a hole penetrating through a relatively thick target layer, whereas the YAG laser has a relatively low power and may be used to partially drill a target layer. However, exemplary embodiments of the present inventive concept are not limited thereto, and a chemical etching method may be used when the upper conductive pattern 120a and the lower conductive pattern 120b are relatively thick. The base via 125 may include materials which are the same as those described above with reference to FIGS. 1A, 1B and 1C. The base via 125 may be formed so as to be connected to the upper conductive pattern 120a and the lower conductive pattern 120b.

Referring to FIG. 4B, the upper insulation layer 130a, the lower insulation layer 130b, a circuit pattern 145, the upper via 135a, and the lower via 135b may be provided.

An upper insulation material layer may be formed on the top surface of the upper conductive pattern 120a and a lower insulation material layer may be formed on the bottom surface of the lower conductive pattern 120b. The upper insulation layer 130a and the lower insulation layer 130b may be formed by curing the upper insulation material layer and the lower insulation material layer. At this time, since the upper and lower insulation material layers are pressed onto the upper conductive pattern 120a and the lower conductive pattern 120b through a pressing process, portions of the upper and lower insulation material layers may be inserted into the space between the upper conductive pattern 120a and the lower conductive pattern 120b. Thus, first through fourth insulation layer protrusions 131a, 133a, 131b, and 133b may be formed. The upper insulation material layer and the lower insulation material layer may include an insulation material, e.g., a material which is the same that of the upper insulation layer 130a (see, e.g., FIG, 1A) described above with reference to FIGS. 1A, 1B and 1C.

The circuit pattern 140 may be positioned relative to the upper and lower conductive patterns 120a and 120b as described above with reference to FIG. 1A. The circuit pattern 140 may include a conductive material. As an example, the circuit pattern 140 may include materials which are the same as those described above with reference to FIGS. 1A, 1B and 1C.

The upper via 135a penetrating through the upper insulation layer 130a and connected to the upper conductive pattern 120a and the circuit pattern 140 and a lower via 135b penetrating through the lower insulation layer 130b and connected to the lower conductive pattern 120b may be formed. The compositions of the upper and lower vias 135a and 135b may be the same as described above with reference to FIGS. 1A, 1B and 1C. The upper and lower vias 135a and 135b may be formed using a method similar to the method of forming the base via 125 described above with reference to FIG. 4A.

Referring to FIG. 4C, upper and lower protective material layers 157 and 177 may be formed. The upper protective material layer 157 may be formed on the circuit pattern 140 and the lower protective material layer 177 may be formed on the bottom surface of the lower insulation layer 130b. According to an exemplary embodiment of the present inventive concept, the upper and lower protective material layers 157 and 177 may be formed through a photo solder resist (PSR) process. The PSR process may be a process for coating a permanent ink on a patterned circuit to protect the circuit and prevent a bridge phenomenon between the circuit and solders in subsequent processes including a surface treatment process and a component mounting process. After the upper protective material layer 157 is formed, the upper contact hole 155 (see, e.g., FIG. 1B) may be formed to expose at least a portion of the top surface of the circuit pattern 140 by etching the upper protective material layer 157. After the lower protective material layer 177 is formed, the lower contact hole 175 (see, e.g., FIGS. 1B and 1C) may be formed to expose at least a portion of a bottom surface of the lower via 135b or at least a portion of the bottom surface of the lower insulation layer 130b by etching the lower protective material layer 177. The upper and lower contact holes 155 and 175 (see, e.g., FIG. 1B) may be formed substantially simultaneously, but exemplary embodiments of the present inventive concept are not limited thereto o.

Referring again to FIGS. 1B and IC, the upper contact layer 160 may be formed on a portion of the circuit pattern 140 exposed by the upper contact hole 155. Side surfaces of the upper contact layer 160 may be covered by the upper sidewall 155W of the upper contact hole 155. The upper contact layer 160 may be formed through non-electrolytic plating and/or electrolytic plating. According to an exemplary embodiment of the present inventive concept, to form the upper contact layer 160, after non-electrolytic plating is performed, electrolytic plating may be performed by using a layer formed through the non-electrolytic plating as a seed layer. The upper contact layer 160 may include P to prevent oxidation of Ni included in the upper contact layer 160. For example, the upper contact layer 160 may include P at a weight ratio of about 5% to about 12%.

The lower contact layer 180 (see, e.g., FIGS. 1B and IC) may be formed on at least a portion of the bottom surface of the lower via 135b and/or at least a portion of the bottom surface of the lower insulation layer 130b exposed by the lower contact hole 175. Side surfaces of the lower contact layer 180 may be covered by the lower sidewall 175W of the lower contact hole 175. A portion of the lower contact layer 180 may be connected to the lower via 135b. The lower contact layer 180 may be formed in a similar mariner to that by which the upper contact layer 160 is formed. According to an exemplary embodiment of the present inventive concept s, the upper contact layer 160 and the lower contact layer 180 may be formed substantially simultaneously, but exemplary embodiments of the present inventive concept are not limited thereto.

The semiconductor chip 200 may be provided on the upper protective layer 150, and the top surface of the semiconductor chip 200 may be connected to the upper contact layer 160 through the bonding wire 300. When the semiconductor chip 200 is provided on the upper protective layer 150, a die attach film (DAF) may be provided at a position on the upper protective layer 150 where the semiconductor chip 200 is to be provided and the semiconductor chip 200 may be bonded thereto. However, exemplary embodiments of the present inventive concept are not limited thereto, and the semiconductor chip 200 may be provided in the form of a flip chip and connected to the package substrate 100 via solder bumps and/or solder balls.

The external connecting terminal 190 may be provided on the lower contact layer 180. The external connecting terminal 190 may be a solder ball or a solder bump. The external connecting terminal 190 may be formed in a reflow process after providing a solder material through electrolytic plating, non-electrolytic plating, CVD, or PVD. The composition of the external connecting terminal 190 may be the same as that described above with reference to FIGS. 1A, 1B and 1C.

According to an exemplary embodiment of the present inventive concept, the base layer 110, the upper insulation layer 130a, the lower insulation layer 130b, the upper protective layer 150, the lower protective layer 170, the lower contact layer 180, and the external connecting terminal 190 may be formed in the CTE adjusting region CAR. The base via 125 and the upper and lower via 135a and 135b need not be disposed in the CTE adjusting region CAR. The upper conductive pattern 120a, the lower conductive pattern 120b, and the circuit pattern 140 need not be formed in the CTE adjusting region CAR. Thus, the semiconductor package 1, in which the mass ratio of a conductive material included in the package substrate 100 is reduced, may be provided.

In a package substrate, when a circuit pattern or vias include(s) a conductive material, e.g., copper, the effective CTE (E-CTE) of the entire package substrate also increases due to the high CTE characteristics of the conductive material. Here, the E-CTE of the package substrate may be an average CTE applied to the entire package substrate, which is calculated in consideration of respective CTEs and ratios of various components included in the package substrate. Thus, to reduce the E-CTE of a package substrate, the amount of a conductive material may be reduced.

In this case, since a power/ground region occupies a relatively large proportion of a conductive material included in a package substrate, reducing an amount of the conductive material included in the power/ground region is effective in enhancing the E-CTE characteristic. Thus, the thickness or the area of a pattern or a via including the conductive material may be reduced. However, in this case, signal integrity/power integrity (SI/PI) characteristics may deteriorate.

According to an exemplary embodiment of the present inventive concept, conductive materials in the power/ground region that does not operate as a signal transmission path in a package substrate design of the prior art may be selectively removed to prevent deterioration of the electrical properties of a package substrate. Here, the power/ground region refers to a region for providing operation power, input/output power, and/or ground potential of a semiconductor package. Such a semiconductor package is described in more detail below with reference to FIG. 5A. Furthermore, the signal transmission path may correspond to the shortest path from among paths for signal transmission from an active surface of the semiconductor chip 200 to each of the external connecting terminals 190. Thus, the conductive materials included in the shortest signal transmission paths are not removed, and the SI characteristic might not be deteriorated. Here, the active surface may be a surface of the semiconductor chip 200 on which an external connection pad is formed. For example, in the case of the semiconductor chip 200 described in more detail above with reference to FIGS. 1A, 1B and 1C, an active surface thereof may be a surface facing in the same direction as the top surface of the package substrate 100, that is, the top surface of the semiconductor chip 200. According to an exemplary embodiment of the present inventive concept, when a semiconductor chip is provided as a flip chip, the active surface of the semiconductor chip may be the bottom surface.

According to an exemplary embodiment of the present inventive concept, when conductive materials are removed, a conductive material in the power/ground region may be removed except for the conductive material in a main power path. Here, the main power path may correspond to the shortest path from among paths from the upper contact layer 160 to the external connecting terminals 190 for power/ground. Thus, a conductive material layer other than a portion corresponding to the main power path, which is a region of a pre-designed power/ground region mainly determining inductance, may be selectively removed, thus reducing the mass ratio of a conductive material of the package substrate 100. Therefore, the conductive material in a region not determining the inductance of the power/ground region in a pre-designed power/ground region may be selectively removed, thus reducing or eliminating deterioration of the PI characteristics.

In a package substrate according to an exemplary embodiment of the present inventive concept, an amount of a conductive material may be reduced by about 7% relative to a conventional package substrate, without deterioration of electrical characteristics, such as electrical conductivity. Thus, according to an exemplary embodiment of the present inventive concept, a package substrate with a reduced E-CTE may be provided without deterioration of electrical characteristics.

Figure 5A:
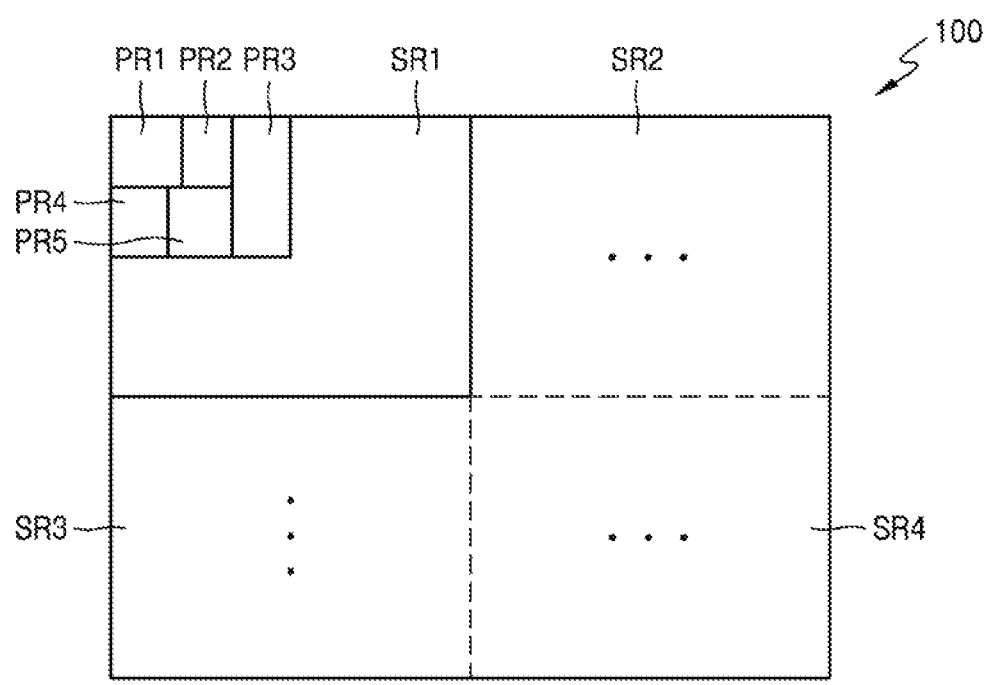
FIG. 5A is a block diagram of a semiconductor package, according to an exemplary embodiment of the present inventive concept.

FIG. 5A is a block diagram of a semiconductor package, according to an exemplary embodiment of the present inventive concept.

Figure 5B:
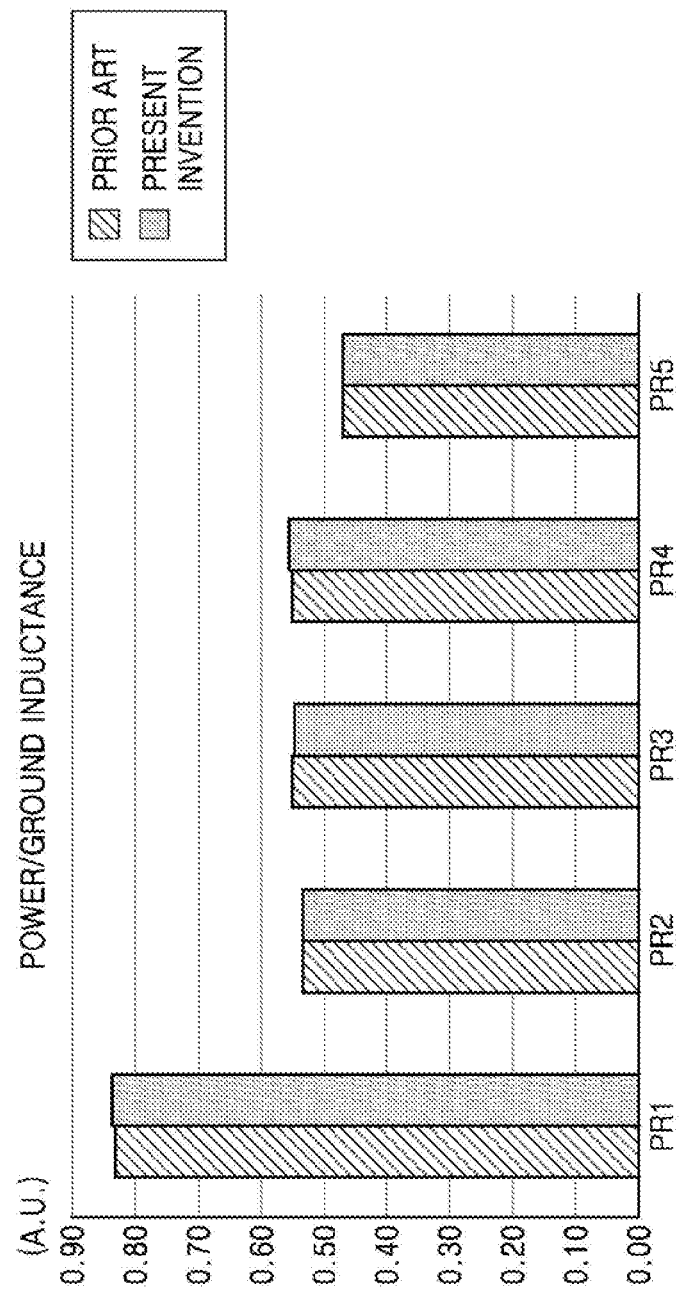
FIGS. 5B and 5C are graphs illustrating an effect of a semiconductor package, according to an exemplary embodiment of the present inventive concept.
Figure 5C:
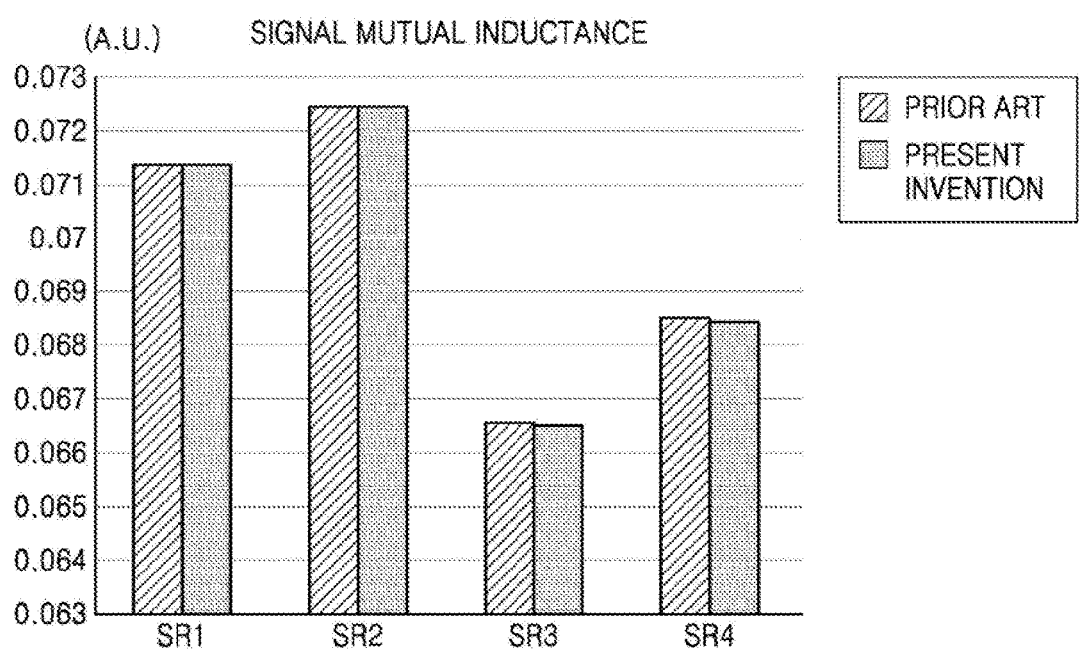

FIGS. 5B and 5C are graphs illustrating an effect of a semiconductor package, according to an exemplary embodiment of the present inventive concept.

Referring to FIG. 5A, first through fourth signal transmitting regions SR1, SR2, SR3, and SR4 may be defined on the package substrate 100, which may substantially equally divide the package substrate 100 into four portions. According to an exemplary embodiment of the present inventive concept, when the package substrate 100 has a substantially rectangular shape, the first through fourth signal transmitting regions SR1, SR2, SR3, and SR4 may correspond to four substantially rectangular portions which are regions into which the package substrate 100 is divided. According to an exemplary embodiment of the present inventive concept, the first through fourth signal transmitting regions SR1, SR2, SR3, and SR4 may be four regions that pass through the center of the package substrate 100 and are separated from one another by two line segments that are substantially parallel to two pairs of edges of the package substrate 100 and substantially perpendicular to each other.

Each of the first through fourth signal transmitting regions SR1, SR2, SR3, and SR4 may include first through fifth power/ground regions PR1, PR2, PR3, PR4, and PR5. The first through fifth power/ground regions PR1, PR2, PR3, PR4, and PR5 may provide central power, provide input and output power, and/or provide ground potential. According to an exemplary embodiment of the present inventive concept, first and second power/ground regions PR1 and PR2 may provide power for operation of the semiconductor package 1 (see, e.g., FIG. 1A). According to an exemplary embodiment of the present inventive concept, the third and fourth power/ground regions PR3 and PR4 may provide power for input/output of the semiconductor package 1. According to an exemplary embodiment of the present inventive concept, the fifth power/ground region PR5 may provide a ground potential.

While first through fifth power/ground regions PR1, PR2, PR3, PR4, and PR5 may be formed adjacent to edges of the first signal transmitting region SR1, exemplary embodiments of the present inventive concept are not limited thereto. Furthermore, although the first through fifth power/ground regions PR1, PR2, PR3, PR4, and PR5 may be substantially rectangular regions, this is an example, and exemplary embodiments of the present inventive concept are not limited thereto. As an example, the first through fifth poorer/ground regions PR1, PR2, PR3, PR4, and PR5 may have various arrangements and shapes.

Referring to FIGS. 5A and 5B, an exemplary average values of inductances of the main power paths of the first through fifth power/ground regions PR1, PR2, PR3, PR4, and PR5 of a package substrate of the prior art and a package substrate according to an exemplary embodiment of the present inventive concept are illustrated. The inductance of the main power path of the semiconductor package according to an exemplary embodiment of the present inventive concept may be substantially equivalent to that of the package substrate of the prior art. As described above with reference to FIGS. 1A, 1B and 1C, the main power path is the shortest path from among paths from the upper contact layer 160 (see, e.g., FIG. 1B) to each of the external connecting terminals 190 for power/ground (see, e.g., FIG. 1B). According to an exemplary embodiment of the present inventive concept, since a conductive material in portions not corresponding to the main power path is selectively removed, the electrical characteristics of the first through fifth power/ground regions PR1, PR2, PR3, PR4, and PR5 of the package substrate do not deteriorate.

Referring to FIG. 5C, exemplary values of the mutual inductances of signal transmission paths of a package substrate of the prior art and a package substrate according to an exemplary embodiment of the present inventive concept are shown as average values of the first through fourth signal transmitting regions SR1, SR2, SR3, and SR4. The signal transmission path corresponds to the shortest path from among paths from an active surface of the semiconductor chip 200 to each of the external connecting terminals 190 for signal transmission, as described for example with reference to FIGS. 1A, 1B and 1C. According to an exemplary embodiment of the present inventive concept, since a conductive material in portions not corresponding to the signal transmission path is selectively removed, respective average values of the mutual inductances of the signal transmission paths of the semiconductor package in the first to fourth signal transmission regions SR1, SR2, SR3 and SR4 may be substantially equal to the that of the conventional package substrate. Thus, electrical characteristics (e.g., electrical conductivity) of the first through fourth signal transmitting regions SR1, SR2, SR3, and SR4 of the semiconductor package according to an exemplary embodiment of the present inventive concept are not deteriorated.

Figure 6:
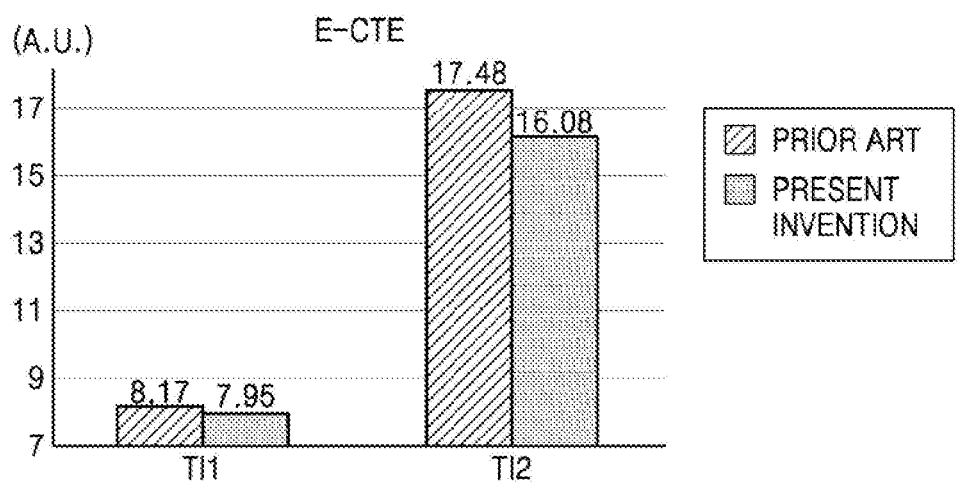
FIG. 6 is a graph illustrating an effect of a semiconductor package, according to an exemplary embodiment of the present inventive concept.

FIG. 6 is a graph illustrating an effect of a semiconductor package, according to an exemplary embodiment of the present inventive concept.

Referring to FIG, 6, there are shown exemplary E-CTEs of a semiconductor package of the prior art and a package substrate according to an exemplary embodiment of the present inventive concept, according, to temperature intervals. A first temperature interval TI1 may be from about 25° C. to about 100° C. A second temperature interval T12 may be from about 200° C. to about 250° C. According to an exemplary embodiment of the present inventive concept, the E-CTE of the package substrate may be reduced by about 2.7% relative to that of the semiconductor package of the prior art in the first temperature interval TI1. According to an exemplary embodiment of the present inventive concept, the E-CTE of the package substrate may be reduced by about 8% relative to that of the semiconductor package of the prior art in the second temperature interval TI2.

While the present inventive concept has been particularly shown and described with reference to exemplary embodiments thereof, it will be understood that various changes in form and details may be made therein without departing from the spirit and scope of the present inventive concept.

What is claimed is:

1. A semiconductor package comprising:
   a circuit pattern extending in a horizontal direction, wherein the circuit pattern is conductive;
   a first insulation layer disposed on the circuit pattern; and
   a semiconductor chip disposed on the first insulation layer,
   wherein the first insulation layer comprises:
      first protrusions which protrude from a bottom surface of the first insulation layer, penetrate through at least a portion of the circuit pattern, and have a mesh structure; and
      a second protrusion which protrudes from the bottom surface of the first insulation layer and penetrates at least a portion of the circuit pattern within coefficient of thermal expansion (CTE) adjusting region of the semiconductor package,
   wherein the second protrusion is spaced apart from the semiconductor chip in the horizontal direction, and wherein the second protrusion has a width in the horizontal direction wider than that of each of the first protrusions.

2. The semiconductor package of claim 1, wherein at least some of the first protrusions are arranged below the semiconductor chip.

3. The semiconductor package of claim 1, wherein the second protrusion does not have a mesh structure.

4. The semiconductor package of claim 1, wherein the first protrusions and the second protrusion have structures tapered in a depth-wise direction orthogonal to the horizontal direction.

5. The semiconductor package of claim 1, further comprising:
   a second insulation layer disposed on a bottom surface of the circuit pattern and extending in the horizontal direction; and
   vias penetrating through the second insulation layer in. a vertical direction orthogonal to the horizontal direction and connected to the circuit pattern.

6. The semiconductor package of claim 5, wherein the second protrusion is spaced apart from the vias in the horizontal direction.

7. The semiconductor package of claim 5, wherein a horizontal distance between a via closest to the second protrusion from among the vias and the second protrusion is three times or greater than a diameter of each of the vias.

8. A semiconductor package comprising:
   a package substrate having a chip mounting region and a non-mounting region defined by the chip mounting region, wherein the package substrate comprises:
      a circuit pattern which extends in the chip mounting region and the non-mounting region in a horizontal direction and comprises a conductive material;
      an insulation layer disposed on the circuit pattern; and
      a semiconductor chip disposed on the package substrate in the chip mounting region,
      wherein the non-mounting region comprises a coefficient of thermal expansion (CTE) adjusting region, and
      a mass ratio of a mass of the conductive material in a portion of the package substrate in the CTE adjusting region to a total mass of the package substrate in the portion of the package substrate in the CTE adjusting region is smaller than a mass ratio of a mass of the conductive material in a portion of the package substrate in the chip mounting region to a total mass of the package substrate in the portion of the package substrate in the chip mounting region.

9. The semiconductor package of claim 8, wherein the mass ratio of the conductive material in a portion of the package substrate in the CTE adjusting region is smaller than a mass ratio of the conductive material in a portion of the package substrate in the non-mounting region.

10. The semiconductor package of claim 8, wherein the conductive material is copper (Cu).

11. The semiconductor package of claim 9, wherein the circuit pattern does not extend in the CTE adjusting region.

12. The semiconductor package of claim 9, wherein insulation layer is arranged across substantially an entire width of the CTE adjusting region in the horizontal direction.

13. The semiconductor package of claim 9, wherein the insulation layer comprises:
   a first protrusion protruding from a bottom surface of a portion of the insulation layer in the chip mounting region; and
   a second protrusion protruding from a bottom surface of a portion of the insulation layer in the CTE adjusting region, and
   a width of the second protrusion is larger than a width of the first protrusion in the horizontal direction.

14. The semiconductor package of claim 13, wherein the width of the second protrusion is substantially identical to a width of the CTE adjusting region in the horizontal direction.

15. A semiconductor package comprising:
   a first circuit pattern extending in a horizontal direction, the first circuit pattern being conductive;
   a first insulation layer disposed on a top surface of the first circuit pattern;
   semiconductor chips disposed on a top surface of the first insulation layer;
   a second insulation layer disposed on a bottom surface of the first circuit pattern; and a second circuit pattern disposed on a bottom surface of the second insulation layer and extending in the horizontal direction, the second circuit pattern being conductive, wherein the first insulation layer comprises:
a plurality of first protrusions which protrude from a bottom surface of the first insulation layer, penetrate through at least a portion of the first circuit pattern, and have a mesh structure; and
second protrusions which protrude from the bottom surface of the first insulation layer, are spaced apart from the semiconductor chips in the horizontal direction, and penetrate at least a portion of the first circuit pattern within a coefficient of thermal expansion (CTE) adjusting region of the semiconductor package, and wherein a horizontal cross-sectional area of each of the second protrusions is larger than a horizontal cross-sectional area of each of the first protrusions.

16. The semiconductor package of claim 15, further comprising first vias which penetrate through the second insulation layer in a vertical direction and interconnect the first circuit pattern and the second circuit pattern, and wherein a horizontal distance between a first via closest to the second protrusions from among the first vias and the second protrusion is three times or greater than a diameter of each of the first vias.

17. The semiconductor package of claim 15, wherein the second insulation layer comprises:
a plurality of third protrusions which protrude from the bottom surface of the second insulation layer, penetrate through at least a portion of the second circuit pattern, and have a mesh structure; and
fourth protrusions which protrude from the bottom surface of the second insulation layer, are spaced apart front the semiconductor chips in the horizontal direction, and penetrate at least a portion of the second circuit pattern, and wherein a horizontal cross-sectional area of each of the fourth protrusions is larger than a horizontal cross-sectional area of each of the third protrusions.

18. The semiconductor package of claim 17, wherein the second protrusions and the fourth protrusions overlap each other in a vertical direction orthogonal to the horizontal direction.

19. The semiconductor package of claim 17, wherein vertical thicknesses of the first and second protrusions are substantially identical to a vertical thickness of the first circuit pattern.

20. The semiconductor package of claim 17, wherein the horizontal cross-sectional area of each of the second protrusions is different from the horizontal cross-sectional area of each of the fourth protrusions.

* * * * *